United States Patent
Harker

(10) Patent No.: US 7,088,752 B2
(45) Date of Patent: Aug. 8, 2006

(54) SLOPE EFFICIENCY MEASUREMENT APPARATUS FOR A LASER DEVICE AND METHOD THEREFOR

(75) Inventor: Andrew Harker, Ipswich (GB)

(73) Assignee: Avago Technologies Fiber IP (Singapore) Ptd. Ltd. (SG)

( * ) Notice: Subject to any disclaimer, the term of this patent is extended or adjusted under 35 U.S.C. 154(b) by 265 days.

(21) Appl. No.: 10/722,395

(22) Filed: Nov. 28, 2003

(65) Prior Publication Data

US 2004/0212390 A1   Oct. 28, 2004

(30) Foreign Application Priority Data

Nov. 28, 2002   (EP)   ................... 02258222

(51) Int. Cl.
*H01S 3/00*   (2006.01)

(52) U.S. Cl. .................. 372/38.01; 372/38.02

(58) Field of Classification Search ............. 372/38.1, 372/38.01
See application file for complete search history.

(56) References Cited

U.S. PATENT DOCUMENTS

| | | | |
|---|---|---|---|
| 4,994,059 A * | 2/1991 | Kosa et al. ................... 606/12 |
| 5,870,217 A * | 2/1999 | Itou et al. .................... 398/97 |
| 6,414,974 B1 | 7/2002 | Russell et al. | |
| 2002/0021641 A1* | 2/2002 | Miyabata et al. ........ 369/53.26 |
| 2004/0208207 A1* | 10/2004 | Kasper et al. ................ 372/26 |

OTHER PUBLICATIONS

IBM technical disclosure bulletin (Temperature and aging compensation of laser drive circuits, Feb. 1994, vol. 37, p. 279-280).*

* cited by examiner

*Primary Examiner*—Minsun Oh Harvey
*Assistant Examiner*—Dung Nguyen

(57) ABSTRACT

The slope efficiency of a laser diode is determined by temporarily adjusting a current applied to the laser and measuring a corresponding change in the average output power. Such prior art techniques require the laser modulation current average to be small to avoid impairment of transmission of data by the laser diode. An optical attenuator opposite an output of a laser diode resolves this problem by maintaining the average power emitted by the laser diode within acceptable operating limits.

21 Claims, 2 Drawing Sheets

SLOPE EFFICIENCY MEASUREMENT APPARATUS FOR A LASER DEVICE AND METHOD THEREFOR

CROSS REFERENCE TO RELATED APPLICATIONS n/a

Statement Regarding Federally Sponsored Research or Development n/a

Sequence Listing n/a

1. Field of Invention

The present invention relates to a slope efficiency measurement apparatus of the type used, for example, to measure performance of a laser device, such as a semiconductor laser diode used in transmitters in an optical communications network. An example of the optical communications network is a Synchronous Optical Network (SONET). The present invention also relates to a method of measuring slope efficiency for the laser device.

2. Background Art

In an optical communications network, a number of transmitter modules are provided for transmitting data. A transmitter module typically comprises a semiconductor laser diode, the laser diode having an associated characteristic curve of output power of light emitted by the laser device versus input current. The characteristic curve has an initial linear portion which extends from an origin and has a very slight upward slope. The initial linear portion is then followed, with increasing input current, by a sharp bend. The characteristic curve then has an operating portion having a relatively steep gradient, the operating portion being substantially linear. The input current corresponding to the sharp bend is known as a threshold current point, emissions by the laser device at currents below the threshold current point being incoherent and emissions by the laser device at currents above the threshold current point being stimulated coherent emissions.

Knowledge of the threshold current point and the gradient of the linear operating portion, referred to as the slope efficiency or differential efficiency, of the laser device is important in order to drive the laser device accurately and efficiently. However, the position of the threshold current point and the slope efficiency vary with temperature and age of the laser device and so it is necessary to monitor the threshold current point and the slope efficiency of the laser device during operation of the laser device in order to control a bias current and/or a modulation current signal applied to the laser device, thereby controlling the, so-called, extinction ratio of the laser device. The bias current is applied to the laser device in order to make the laser device operate in the linear operating portion of the characteristic curve. The modulation current signal is applied to the laser device to modulate the electromagnetic energy, emitted by the laser device in the linear operating portion, with data to be transmitted, the data being borne by the modulation current signal.

The extinction ratio of the laser device is the ratio of the output power of the laser device corresponding to the transmission of a logic "1" to the output power corresponding to the transmission of a logic "0". Typically, the extinction ratio is set to a value close to 10. Accurate discrimination between logic 1s and logic 0s is facilitated by high values of extinction ratio, but the output power performance of the laser device becomes nonlinear when output power corresponding to logic 0 is close to the output power at the threshold current point, increasing the degradation caused by chromatic dispersion. Movement of the extinction ratio away from the set value results in an increase in the bit error rate of the optical communications network. It is thus important that the extinction ratio is maintained close to the set value over the optimum operating conditions and the life of the transmitter module.

U.S. Pat. No. 6,414,974 discloses a method and control circuit for controlling an extinction ratio. The slope of an operating portion of the laser diode is determined by increasing the magnitude of the modulation current signal, $I_m$, by an incremental test amount, $\Delta I_m$, the incremental test amount, $\Delta I_m$, being a small percentage of the magnitude of the modulation current signal, $I_m$. In response to increasing the magnitude of the modulation current signal by the incremental test amount, $\Delta I_m$, a corresponding increase, $\Delta P_{av}$, in average power, $P_{av}$, output by the laser diode results. The corresponding increase $\Delta P_{av}$ is determined and compared to a power increment reference value, $\Delta P_{avref}$. If the corresponding increase, $\Delta P_{av}$, differs from the power increment reference value, $\Delta P_{avref}$, a correction is applied to the magnitude of the modulation current signal, $I_m$. U.S. Pat. No. 6,414,974 states that the incremental test amount $\Delta I_m$, should be sufficiently small so as not to affect normal operation of the laser diode and, in one embodiment disclosed therein, the incremental test amount, $\Delta I_m$, does not exceed 5% of the magnitude of the modulation current signal, $I_m$, and preferably does not exceed 1% of the magnitude of the modulation current signal, $I_m$.

Whilst U.S. Pat. No. 6,414,974 requires the incremental test amount, $\Delta I_m$, to be relatively small in order to avoid impairment of transmission of data by the laser diode, such a requirement compromises the accuracy of the calculation of the slope efficiency associated with the laser diode. For example, the increase $\Delta P_{av}$ in the average power, $P_{av}$, for a 1% increase in the incremental test amount, $\Delta I_m$, can be represented by either two or three bits, a possible error of 50%, if eight bit digitization is used. The error is reduced if a larger increase in the incremental test amount, $\Delta I_m$, is used but the impairment of transmission of data will increase correspondingly. Consequently, the threshold current point, $I_{th}$, associated with the laser diode cannot be calculated with accuracy, making control of the bias current applied to the laser diode inaccurate, and thus causing the extinction ratio to depart from its optimum value.

SUMMARY OF THE INVENTION

According to a first aspect of the present invention, there is provided a method of measuring slope efficiency for a laser device, the method comprising the steps of: altering the magnitude of a current driving the laser device; tapping a predetermined percentage of electromagnetic radiation generated by stimulated emission in response to the current driving the laser; measuring the power of the tapped predetermined percentage of electromagnetic radiation; attenuating untapped electromagnetic radiation; and calculating slope efficiency of the laser using knowledge of the alteration of the current and the measured power of the tapped predetermined percentage of electromagnetic radiation.

Preferably, the magnitude of the current signal is altered by at least about 5% of the magnitude of the modulation current signal prior to alteration thereof. More preferably, the current driving the laser is a modulation current of a signal and the magnitude of the set current signal is altered by between about 5% and about 10% of the magnitude of the modulation current signal prior to alteration thereof.

Preferably, the modulation current signal is altered by providing the modulation current signal with a sinusoidal component, the frequency of the sinusoidal component being below a data rate for communicating data using the modulation current signal.

Preferably, the method further comprises the steps of: measuring the attenuated untapped electromagnetic radiation; and controlling the attenuation of the untapped electromagnetic radiation in response to the measurement of the attenuated untapped electromagnetic radiation.

Alternatively, the step of attenuating the untapped electromagnetic radiation further comprises: attenuating the untapped electromagnetic radiation by a predetermined percentage.

In a first embodiment of the invention, a method of measuring a threshold current point for a laser device comprises the method of measuring slope efficiency as set forth above in accordance with the first aspect of the present invention. However, the method further comprises the step of: using the calculated slope efficiency to determine the threshold current point.

In a second embodiment of the invention, a method of controlling a bias current for a laser device comprises the steps of: measuring the laser threshold current point in accordance with the method of measuring the threshold current point as set forth above in accordance with the first embodiment; and adjusting the bias current in response to the measured threshold current point.

In a third embodiment of the invention, a method of controlling a modulation current signal for a laser device comprises the steps of: measuring the slope efficiency in accordance with the method of measuring slope efficiency as set forth above and adjusting the modulation current signal in response to the measured slope efficiency.

In a fourth embodiment of the invention, a method of controlling an extinction ratio for a laser device comprises controlling the bias current as set forth above in accordance with the second embodiment and/or the method of controlling the modulation current signal as set forth above in accordance with the third embodiment.

According to a second aspect of the invention, a slope efficiency measurement apparatus for a laser device comprises: a current driver unit coupled to a control unit, the control unit being arranged to alter the magnitude of the current generated by the current driver unit; a tap for tapping a predetermined percentage of electromagnetic radiation generated by stimulated emission in response to the modulation current signal; a power measurement unit for measuring the power of the tapped predetermined amount of electromagnetic radiation; an attenuator for attenuating untapped electromagnetic radiation; and the control unit being arranged to calculate the slope efficiency using knowledge of the alteration of the current and the measured power of the tapped predetermined amount of electromagnetic radiation.

Preferably, the current driver unit is a modulation current signal for altering the magnitude of a modulation current signal applied to the laser and the control unit is arranged to alter the magnitude of the modulation current by at least about 5% of the magnitude of the modulation current prior to alteration thereof. More preferably, the control unit is arranged to alter the magnitude of the modulation current by between about 5% and about 10% of the magnitude of the current prior to alteration thereof.

Preferably, the control unit is arranged to alter the modulation current by providing the modulation current with a sinusoidal component, the frequency of the sinusoidal component, when in use, being below a data rate for communicating data using the modulation current.

Preferably, the apparatus further comprises: a further power measurement unit for measuring power of the attenuated untapped electromagnetic radiation emitted by the laser; and the control unit is further arranged to control attenuation of the untapped electromagnetic radiation in response to the measurement of the attenuated untapped electromagnetic radiation. Alternatively, the control unit may be further arranged to attenuate the untapped electromagnetic radiation by a predetermined amount.

In the first embodiment of the invention, a threshold current point measurement apparatus for a laser device, comprises: the slope efficiency measurement apparatus as set forth above in accordance with the second aspect of the present invention, and wherein: the control unit is further arranged to calculate the threshold current point using the calculated slope efficiency.

In the second embodiment, a bias current control apparatus for a laser device, comprises: the threshold current point measurement apparatus as set forth above in accordance with the second embodiment; and a bias current driver unit coupled to the control unit; wherein: the control unit is arranged to adjust a bias current generated by the bias current driver unit in response to the measured threshold current point.

In the third embodiment, a modulation current control apparatus for a laser device, comprises: the slope efficiency measurement apparatus as set forth above in accordance with the second aspect of the present invention; and wherein: the control unit is further arranged to adjust the modulation current in response to the measured slope efficiency.

In the fourth embodiment, an extinction ratio control apparatus for a laser device, comprises the bias current control apparatus as set forth above in accordance with the second embodiment and/or the modulation current control apparatus as set forth above in accordance with the third embodiment.

It is thus possible to provide a slope efficiency measurement apparatus and a method therefore that can measure slope efficiency associated with a laser device more accurately than known apparatus and methods. Consequently, the threshold current point associated with the laser device can also be determined with greater accuracy than with known apparatus and methods. In addition, the improved accuracy in measurement is achieved without impairment of the optical data signal emitted by the laser device. It is thus also possible to control the bias current and/or the magnitude of the modulation current applied to the laser device, and hence the extinction ratio of the laser device, with greater precision than with known apparatus and methods. As a consequence, a lower margin can be provided between a set-up value of the extinction ratio and a specification limit of the laser device. Generally, a margin is provided between the set-up value and the specification limit so that deficiencies in the control of the extinction ratio do not cause the extinction ratio to vary outside the specification limit, thereby improving bit error rate when transmitting signals over dispersive optical fiber.

BRIEF DESCRIPTION OF THE DRAWING

At least one embodiment of the invention will now be described, by way of example only, with reference to the accompanying drawings, in which.

DETAILED DESCRIPTION OF THE DRAWING

Figure 1:
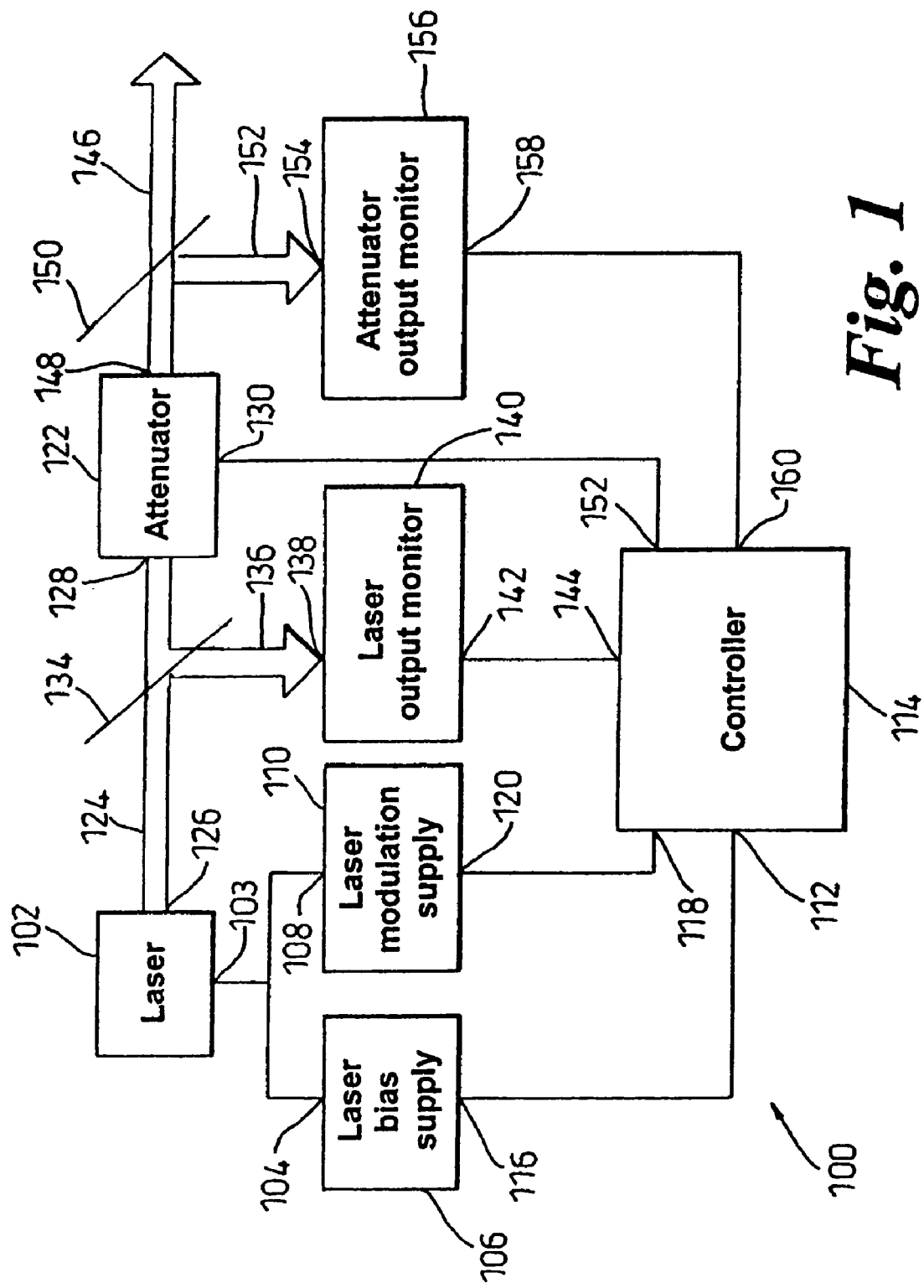
FIG. 1 is a schematic diagram of a preferred embodiment constituting an embodiment of the invention.

Referring to FIG. 1, a transmitter module 100 comprises a laser diode 102 having an input 103 coupled to an output 104 of a bias current supply circuit 106 and an output 108 of a modulation current supply circuit 110. A first output 112 of a control unit 114 is coupled to an input 116 of the bias current supply circuit 106, and a second output 118 of the control unit 114 is coupled to an input 120 of the modulation current supply circuit 110.

An optical attenuator 122, for example a Micro-Electro-Mechanical System (MEMS) optical attenuator or a Liquid Crystal (LC) optical attenuator, or any other known optical attenuator, is disposed opposite the laser diode 102 in a first propagation path 124 extending from a first optical output 126, for example a front facet, of the laser diode 102 to an input port 128 of the attenuator 122. A control input 130 of the attenuator 122 is coupled to a third output 132 of the control unit 114.

A first tap 134, for example a first 99:1 beam splitter, is disposed in the first propagation path 124 and positioned relative to laser diode 102 and the attenuator 122 so as to maintain the first propagation path 124 and create a second propagation path 136 substantially perpendicular to the first propagation path 124. The second propagation path 136 extends from the first tap 134 to an input port 138 of a first power measurement unit 140, an output 142 of the first power measurement unit 140 being coupled to a first input 144 of the control unit 114.

Alternatively, the input port 138 of the first power measurement unit 140 can be disposed adjacent another optical output (not shown) of the laser diode 102, for example, a back facet. In this embodiment, the second propagation path 124 can extend from the back facet of the laser diode 102 to the input port 138 of the first power measurement unit 140. Consequently, the first tap 134 is not required.

A third propagation path 146 extends from an output port 148 of the attenuator 122. Optionally, a second tap 150, for example a second 99:1 beam splitter, is disposed in the third propagation path 146 relative to the output port 148 of the attenuator 122 so as to maintain the third propagation path 146 and create a fourth propagation path 152 substantially perpendicular to the third propagation path 146. The fourth propagation path 152 extends from the second tap 150 to an input port 154 of a second power measurement unit 156, an output 158 of the second power measurement unit 156 being coupled to a second input 160 of the control unit 114.

Whilst, in this example, the control unit 114 is a single unit, it should be understood that the control unit 114 can comprise any number of sub-components, for example controllers, processors and/or co-processors.

In operation, the control unit 114 sends a first control signal to the bias current supply circuit 106 and the bias current supply circuit 106 applies a first driver current to the laser diode 102 in order to provide a bias current, $I_b$, of sufficiently high amplitude to cause the laser diode 102 to be in an operating mode in which light is generated by the laser diode 102 by the process of stimulated emission.

A data signal to be transmitted by the laser diode 102 is received at an input (not shown) of the control unit 114 and a control signal is generated by the control unit 114 in response to the received data signal. The control signal is received by the modulation current supply circuit 110, which generates a modulation current driver signal, $I_m$, in response to the received control signal. The application of the modulation current signal, $I_m$, serves to modulate the light generated by the laser diode 102 with the data signal.

In terms of an optical output power v. input current characteristic curve, the bias current, $I_b$, is applied to ensure that the laser diode 102 operates in the operating portion of the characteristic curve, i.e. above the threshold point, $I_{th}$, of the laser diode 102.

Light emitted by the laser diode 102 is incident upon the first tap 134 and a first small proportion, for example 1%, of the light emitted by the laser diode 102 is directed along the second propagation path 136 to the input port 138 of the first power measurement unit 140 by the first tap 134. The first small proportion of the emitted light is incident upon a sensor (not shown) of the first power measurement unit 140 and the first power measurement unit 140 generates a first average power measurement signal in response to the incidence of the first small proportion of the light emitted by the laser diode 102.

A first remaining, untapped, proportion of the emitted light continues to propagate along the first propagation path 124 to the input port 128 of the optical attenuator 122 and is attenuated by an attenuation factor dictated by an attenuation control signal issued by the control unit 114. When the slope efficiency, $\eta S$, of the laser diode 102 is not being measured, substantially no attenuation of the first, untapped, proportion of the emitted light takes place.

If the optional second tap 150 and the second power measurement unit 156 are provided, light output from the attenuator 122 follows the third propagation path 146 and is incident upon the second tap 150 whereupon a second small proportion, for example 1%, of the light output from the attenuator 122 is directed along the fourth propagation path 152 to the second power measurement unit 156. The second proportion of the light output from the attenuator 122 is incident upon a sensor (also not shown) of the second power measurement unit 156 and the second power measurement unit 156 generates a second average power measurement signal in response to the incidence of the second small proportion of the light output from the attenuator 122. A second remaining, untapped, proportion of the light output from the attenuator 122 continues to propagate along the third propagation path 146. The onward propagation of the second untapped proportion of the light output from the attenuator 122 is only relevant to the invention in so far as the amplitude of the untapped proportion of the light emitted from the attenuator 122 needs to be within a predetermined range of amplitudes. Consequently, the onward propagation and destination of the second untapped proportion of the light output from the attenuator 122 will not be described further herein.

Figure 2:
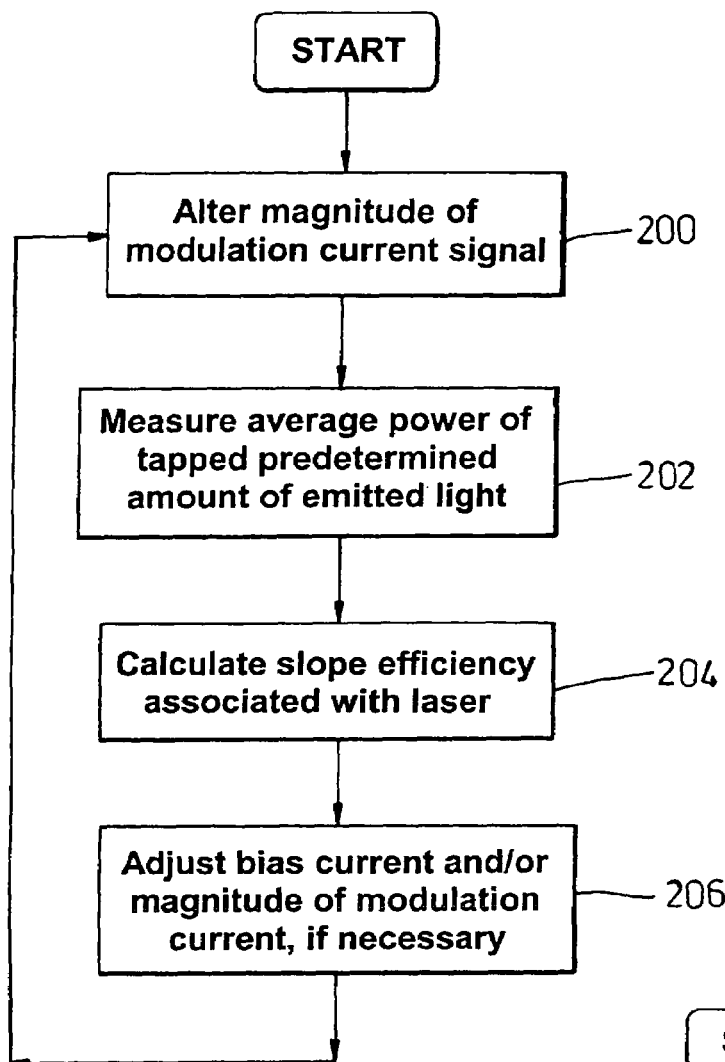
FIG. 2 is a flow diagram of a first method of using the apparatus of FIG. 1.

Referring to FIG. 2, to measure performance of the laser diode 102 in order to identify changes in the slope efficiency, $\eta S$, of the laser diode 102, the control unit 114 alters the control signal the control unit generates (Step 200) so as to alter the amplitude (magnitude) of the modulation current signal, $I_m$, by a test amount $\Delta I_m$. The control unit 114 monitors the first average power measurement signal in order to measure (Step 202) a change in the average power of the light emitted by the laser diode 102 in response to the alteration of the modulation current signal, $I_m$, by the test amount $\Delta I_m$.

Given that the control unit 114 possesses information concerning the average power of the light emitted by the laser diode 102 both pre- and post- alteration of the modulation current signal, $I_m$, by the test amount, $\Delta I_m$, the control unit 114 is able to calculate (Step 204) the slope efficiency, $\eta S$, of the laser diode 102.

Whilst modifying the modulation current signal, $I_m$, the control unit 114 issues the attenuation control signal to the attenuator 122 so that the attenuator 122 attenuates the first, untapped, proportion of the light emitted by the laser diode 102 by a predetermined amount (the attenuation factor) to maintain the amplitude of the average power of first, untapped, proportion of the light emitted by the laser diode 102 within the predetermined range of amplitudes. The predetermined amount of attenuation dictated by the attenuation control signal can be derived empirically and stored in a look-up table (not shown) for retrieval by the control unit 114 for a given or previously determined slope efficiency, $\eta S$, and the test amount, $\Delta I_m$.

Figure 3:
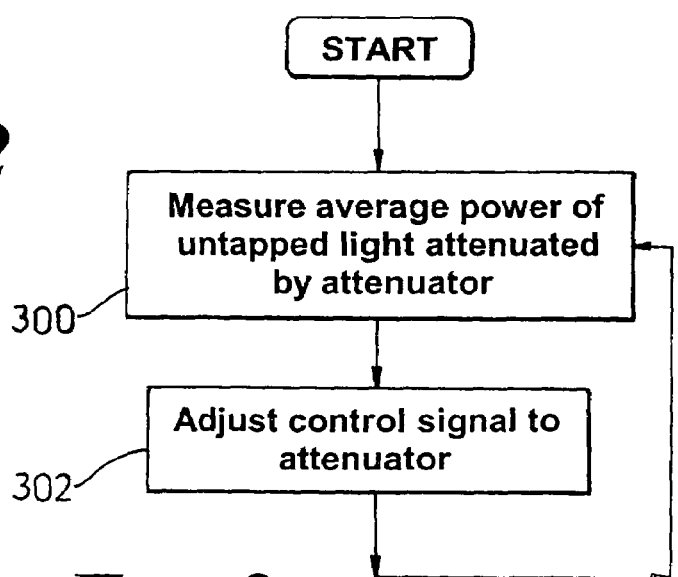
FIG. 3 is a flow diagram of an optional method of using the apparatus of FIG. 1.

Alternatively, as in this example, the second tap 150 and the second power measurement unit 156 can be used as part of a control loop to alter, dynamically, the attenuation factor in response to the second average power measurement signal. Referring to FIG. 3, the average power of the second small proportion of the light output from the attenuator 122 tapped by the second tap 150 is measured (Step 300), the second average power measurement signal being generated in response to the second small proportion of the light output from the attenuator 122 as described above. The control unit 114 then adjusts (Step 302) the attenuation control signal in response to the second average power measurement signal so as to maintain the amplitude of average power of the second untapped proportion of the light emitted by the laser diode 102 within the predetermined range of amplitudes.

The attenuation of the first, untapped, proportion of the light emitted by the laser diode 102 permits the test amount, $\Delta I_m$, to be increased beyond 5% of the amplitude of the modulation current signal, $I_m$, prior to application of the test amount, $\Delta I_m$. In this example, optimal performance is attained if the test amount is between about 5% and about 10% of the original amplitude of the modulation current signal.

In another embodiment, the control unit 114 is arranged to apply the test amount, $\Delta I_m$, as a sinusoidal signal having a frequency below the data rate of the data signal.

Once the control unit 114 has measured the slope efficiency, $\eta S$, of the laser diode 102, the control unit 114 can use the knowledge of the slope efficiency, $\eta S$, to calculate the threshold current point, $I_{th}$, for example, by extrapolation. With knowledge of the slope efficiency and, optionally, the threshold current point, $I_{th}$, of the laser diode 102, the control unit 114 adjusts (Step 206) the first control signal and/or the second control signal so as to alter, respectively, the bias current, $I_b$, and/or the modulation current, $I_m$, flowing through the laser diode 102.

Control of the bias current, $I_b$, and/or the modulation current, $I_m$, is therefore possible, and hence control of the extinction ratio of laser diode 102 is possible in the face of changes to the threshold current point, $I_{th}$, and/or the slope efficiency, $\eta S$, of the laser diode 102 due to temperature and/or ageing effects.

It should be appreciated that references to "light" herein refer to electromagnetic radiation of wavelengths between about 300 nm and about 10 µm, preferably between about 400 nm and about 2 µm, and very preferably between about 800 nm and about 1700 nm.

The invention claimed is:

1. A method of measuring slope efficiency of a semiconductor diode laser device, the method comprising the steps of:
    altering the magnitude of current driving the semiconductor diode laser device;
    tapping a predetermined percentage of electromagnetic radiation generated by stimulated emission in response to the laser device being driven by the current;
    measuring the power of the tapped predetermined percentage of electromagnetic radiation;
    controlling the attenuation of untapped electromagnetic radiation; and
    calculating the slope efficiency based on the magnitude of the alteration of the current and the measured power of the tapped predetermined percentage of the electromagnetic radiation.

2. A method as claimed in claim 1, wherein the current is a modulation current signal having a magnitude that is altered at least about 5% of the magnitude of the modulation current signal current prior to alteration thereof.

3. A method as claimed in claim 2, wherein the magnitude of the modulation current signal is altered by between about 5% and about 10% of the magnitude of the modulation current signal prior to the alteration thereof.

4. A method as claimed in claim 1, wherein the current includes data modulating the current at a data rate in excess of a predetermined rate and the altering of the current is with a sinusoidal component having frequency components only outside the data rate.

5. A method as claimed in claim 1, wherein the attenuation of the untapped electromagnetic magnetic radiation is optical, and further comprising the steps of:
    measuring the power of the attenuated untapped electromagnetic radiation generated by stimulated emission in response to the semiconductor diode laser device being driven by the current; and
    controlling the optical attenuation of the electromagnetic radiation in response to the measurement of the attenuated untapped electromagnetic radiation.

6. A method as claimed in claim 1, wherein the attenuation of the untapped electromagnetic magnetic radiation is optical, and further comprising the steps of:
    measuring the power of the attenuated untapped electromagnetic radiation generated by stimulated emission in response to the semiconductor diode laser device being driven by the current; and
    controlling by a predetermined amount the optical attenuation of the electromagnetic radiation in response to the measurement of the attenuated untapped electromagnetic radiation.

7. The method of claim 1 further comprising calculating a threshold current point for the semiconductor diode laser device by using the calculated slope efficiency.

8. The method of claim 7, wherein the current driving the semiconductor diode laser device includes a bias current and further comprising adjusting the bias current in response to the calculated threshold current point.

9. The method of claim 2, wherein the current driving the semiconductor diode laser device includes a bias current and further comprising the step of adjusting the modulation current in response to the measured slope efficiency.

10. The method of claim 8, further including controlling an extinction ratio for the semiconductor diode laser device by controlling the bias current in response to the calculated threshold current point.

11. The method of claim 9, further including controlling an extinction ratio for the semiconductor diode laser device by controlling the modulation current in response to the measured slope efficiency.

12. A slope efficiency measurement apparatus for a semiconductor diode laser device, the apparatus comprising:
- a current driver unit coupled to a control unit, the control unit being arranged to alter the magnitude of a current generated by the current driver unit and arranged to drive the semiconductor diode laser device;
- a tap for tapping a predetermined percentage of electromagnetic radiation the semiconductor diode laser device is adapted to generate by stimulated emission in response to the current generated by the driver unit;
- a power measurer for measuring the power of the tapped predetermined percentage of electromagnetic radiation;
- an attenuator for attenuating untapped electromagnetic radiation the semiconductor diode laser device is adapted to generate by stimulated emission in response to the current generated by the driver unit; and
- the control unit being arranged to calculate the slope efficiency based on the magnitude of the alteration of the current and the measured power of the tapped predetermined percentage of the electromagnetic radiation.

13. An apparatus as claimed in claim 12 wherein the current is a modulation current signal and the control unit is arranged to alter the magnitude of the modulation current signal by at least about 5% of the magnitude of the modulation current signal prior to alteration thereof.

14. An apparatus as claimed in claim 13 wherein the control unit is arranged to alter the magnitude of the modulation current signal by between about 5% and about 10% of the magnitude of the modulation current signal prior to alteration thereof.

15. An apparatus as claimed in claim 12 further including a data source for applying a data signal having a data rate to the laser device and wherein the control unit is arranged to (a) derive a modulation current signal for altering the magnitude of the current the control unit is arranged to apply to the semiconductor diode laser device, and (b) altering the modulation current signal with a sinusoidal component having only frequency components outside the data rate of the data signal applied to the semiconductor diode laser device.

16. An apparatus as claimed in claim 12, wherein the attenuator is an optical attenuator, further comprising a further power measurement unit for measuring power of the optically attenuated untapped electromagnetic radiation; and the control unit is arranged for controlling optically attenuation of the untapped radiation in response to the measurement of the optically attenuated untapped electromagnetic radiation.

17. An apparatus as claimed in claim 12 further comprising an optical attenuator for optically attenuating, by a predetermined amount, untapped electromagnetic radiation the semiconductor diode laser device is adapted to generate by stimulated emission in response to the current signal generated by the driver unit.

18. An apparatus as claimed in claim 12 wherein the control unit is further arranged to calculate the semiconductor diode laser device threshold current point by using the calculated slope efficiency.

19. An apparatus as claimed in claim 18 further including a bias current driver unit for the semiconductor diode laser device coupled to the control unit; wherein the control unit is arranged to adjust a bias current generated by the bias current driver unit in response to the measured threshold current point.

20. An apparatus as claimed in claim 12 wherein the control unit is further arranged to adjust the current the drive unit is arranged to supply to the laser device in response to the measured slope efficiency.

21. The apparatus of claim 12 in combination with a semiconductor diode laser device.

* * * * *